Jan. 16, 1962

D. C. DICKSON, JR

SEMICONDUCTOR DEVICE

Filed Aug. 7, 1959

3,017,550

INVENTOR.
Donald C. Dickson, Jr.
BY Mueller & Aichele
Attys.

3,017,550
SEMICONDUCTOR DEVICE
Donald C. Dickson, Jr., Phoenix, Ariz., assignor to Motorola, Inc., Chicago, Ill., a corporation of Illinois
Filed Aug. 7, 1959, Ser. No. 832,342
7 Claims. (Cl. 317—234)

This invention relates generally to semiconductor diodes, and more particularly to a Zener diode with high power dissipation capabilities and with a three terminal construction that provides load protection.

Semiconductor diodes that are commercially available at the present time generally include a semiconductor die with two leads or terminals connected to the opposite sides of the die. The die is enclosed in a case, and the leads usually extend through opposite ends of the case. This general type of construction is employed for many types of semiconductor diodes including diodes of the Zener type.

One disadvantage of this two-terminal construction as applied to Zener diodes is encountered in voltage regulation applications. A Zener diode may be connected in a shunt circuit path which branches off from a main circuit path between a power source and a load to provide voltage regulation. It is sometimes necessary to disconnect the diode (for instance, for replacement or test purposes), and if it is a two-terminal diode, unregulated voltage will be applied to the load through the main circuit. The load may be extremely sensitive to damage from high voltage, and it is highly desirable to provide a simple and economical way to protect the load from such damage.

For some applications it is desirable to provide Zener diodes with a high power dissipation rating. Power diodes of the two-terminal construction described above are available, and in these prior art devices one of the terminals is often a metallic stud which may be screwed into a metallic chassis or heat radiator which dissipates heat generated within the diode during operation. The other terminal of these devices is usually a wire lead extending away from the stud. Such a unit is not especially adapted to be plugged into a socket because the wire and stud extend in opposite directions. Also, such devices may not provide sufficient heat dissipation for certain applications.

It is an object of the present invention to provide a Zener diode which will protect a load from excessive voltage when the diode is removed from a power supplying circuit that is connected to the load.

Another object of the invention is to provide a semiconductor diode which has a low thermal resistance characteristic of about one degree centigrade per watt so that heat generated within the device during operation will not adversely affect the structure or performance of the device.

A feature of the invention is the provision of a semiconductor diode which in a specific embodiment is a Zener diode, and which has a three-terminal construction with an internal jumper means connected between two of the terminals, and a semiconductor die connected between the jumper and the third terminal, such that the jumper terminals may be connected in a main current path, and will open-circuit this path when the diode is disconnected.

The present device utilizes the invention of an application of Dale Kelley, Serial No. 551,498, filed December 7, 1955, and the continuation-in-part thereof Serial No. 847,735, filed October 21, 1959, which provides a mount for a semiconductor unit, including a one-piece metal base with two terminal pins extending through the thickness of the base, and metal connecting means supported by the terminal pins over a pedestal on the base. The semiconductor die which provides the diode of the present invention may be soldered to the pedestal and to an extension of the connecting means. In this construction, the base has substantial thickness and provides excellent heat dissipation, both the base and the connecting means are economically stamped or formed parts, and the device may be conveniently plugged into a socket.

Certain specific embodiments of the invention are illustrated in the accompanying drawings in which:

FIG. 1 is a view that is partly structural and partly schematic, illustrating a three-terminal Zener diode mounted on a chassis and plugged into a socket that is connected in an electrical circuit;

FIGS. 2 and 2*a* are respectively a plan view and a side view of a jumper clip or connecting means included in the Zener diode of FIG. 1;

The illustrated embodiment of the invention is a power diode of the Zener type, including a semiconductor die with a rectifying junction and regions of opposite conductivity type on either side of the junction. One side of the semiconductor die is soldered to a pedestal on a one-piece metal base, which is relatively thick and of large area to provide effective heat transfer. The other side of the semiconductor die is soldered to a connecting means which is also secured to two terminal pins extending through openings in the base. The connecting means in the form of a clip or formed wire portions, is conductively connected to both pins and serves as a jumper, and the pins are insulated from the metal base. Thus, the package has three terminals, with the base being one terminal and the pins the other two. The device can be connected in a socket which is wired so that a main circuit path passes in one pin, through the jumper clip, and out the other pin, and with another circuit path that branches off from the jumper clip, passes through the semiconductor diode, and out the third terminal. Thus, if the diode unit is removed from the socket, the main circuit path will be open-circuited, and this will prevent excessive voltage from being applied to a load connected to the main circuit path.

Figures 1, 5, 6:
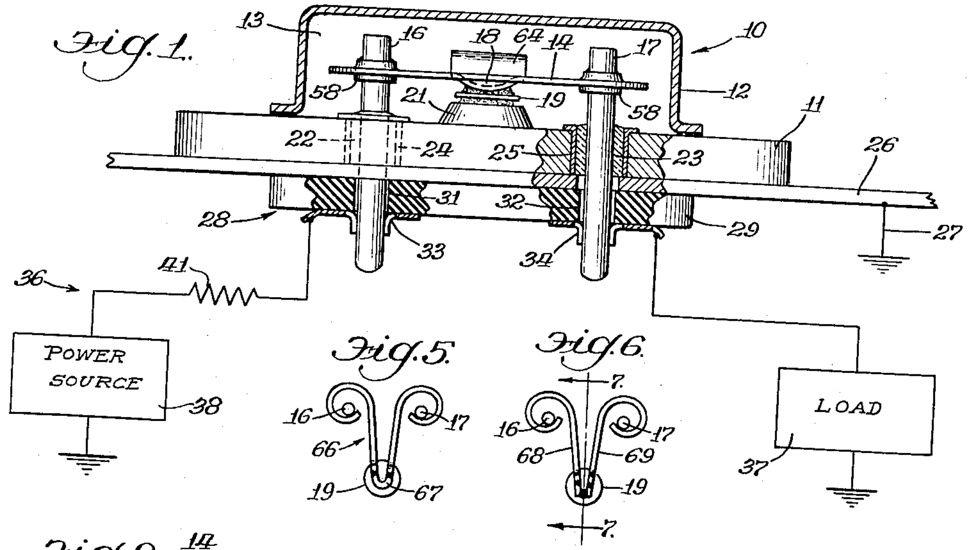
FIG. 5 is a view of a modification of the connecting means of my invention comprising a one-piece formed wire member soldered to the semiconductor means and to the terminal pins.
FIG. 6 is a further modification with two wires constituting the connecting means.

The Zener diode embodiment of the invention illustrated in FIG. 1 is designated generally as 10 and includes a conductive base 11, preferably of copper which has excellent thermal and electrical conduction characteristics. A cap 12 on the base provides an enclosure 13 in which there is a jumper clip 14 extending between and supported on two terminal pins 16 and 17. The clip 14 has a central tongue 18 which is soldered to one side of a semiconductor die 19, which is preferably a diffused junction disc of silicon. The other side of the die 19 is soldered to a pedestal or raised portion 21 integral with the conductive base 11.

The terminal pins 16 and 17 extend perpendicularly through the base 11 and are insulated from the base by glass rings 22 and 23 surrounded by metal sleeves 24 and 25 which are soldered to the base 11. The pin, glass ring, and sleeve are pre-assembled as a unit called a "feed-through." The base itself provides the third terminal of the diode 10. The base 11 may be secured to a metallic chassis or other support which, together with the base, provides a thermally and electrically conductive path. Electrical connections may be made either to the chassis or to the base, and in FIG. 10 the chassis 26 is connected to ground potential by line 27.

Figure 4:
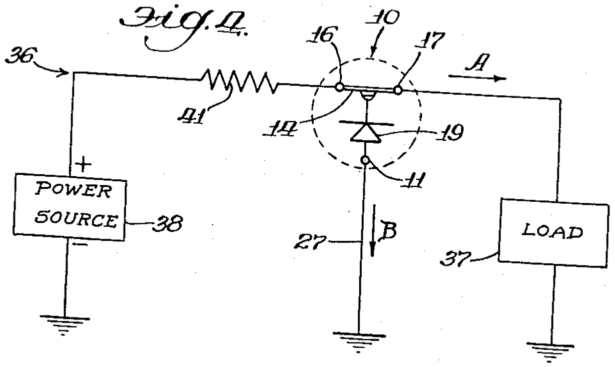
FIG. 4 is a schematic diagram of a circuit including a three-terminal Zener regulator which protects a load against over-voltage.

The terminal pins 16 and 17 are plugged into a socket 28, which consists of an insulating member 29 secured to the chassis 26 with openings 31 and 32 through which the pins extend. The pins fit disengageably into spring connectors 33 and 34, and these connectors are wired in a circuit, designated generally as 36, which is also illustrated in FIG. 4. In the circuit 36 the diode 10 serves as a voltage regulator which maintains a relatively constant direct current voltage across a load 37, independent of moderate voltage variations in the power supplied by the power source 38.

Power is supplied from the source 38 to the load 37 through a main circuit path indicated by the arrow A in FIG. 4, and the Zener diode 10 is connected in this main circuit path and also in a branch circuit path indicated by the arrow B in FIG. 4. According to the established convention, current flows from the positive terminal of the power source 38 through the resistor 41, in terminal 16, through the jumper 14, and out terminal 17 to the load 37. The return path is through ground as indicated. Normally only a small reverse current will flow through the branch circuit B which includes the semiconductor element 19, the base 11 which acts as the third terminal as indicated in FIG. 4, and grounded line 27. The branch current is small because the semiconductor element 19 which provides the voltage regulating function is biased in the reverse direction, and therefore, presents a very high impedance to the source voltage. The semiconductor element 19 has an inverse breakdown characteristic, known as an avalanche or Zener characteristic, such that when the reverse bias applied thereto exceeds a given voltage level, the diode becomes highly conductive. The Zener characteristic is a well-known phenomenon in semiconductor devices and will not be described from a theoretical standpoint since this is not pertinent to the invention.

In some applications, the Zener voltage of the diode 10 is somewhat higher than the operating voltage that is normally applied to the load 37. As long as variations in the voltage level supplied by the power source 38 do not cause the reverse bias on the semiconductor element 19 to exceed its Zener voltage, the branch current B is small. If the supply voltage varies enough to increase the bias on the semiconductor element to the Zener level, the element starts to draw more current. The extra current increases the voltage drop across the resistor 41, and this limits the voltage applied to the load 37.

One of the most advantageous circuit applications for the Zener diode of the invention are those in which continuous voltage regulation is provided. In this case, the Zener voltage is below the applied voltage. Thus, the diode is normally in the heavy conduction region and together with the limiting resistor 41 maintains the supply voltage for the load at a constant level. When the diode is disconnected, there is no chance for the higher voltage from the source to damage the load.

It may be seen from FIGS. 1 and 4 that if the diode 10 is removed from the socket 28 the main current path A will be open-circuited to prevent unregulated voltage from being applied to the load 37. As previously mentioned, the load may be extremely sensitive to damage caused by excessively high unregulated voltage. As a specific example, the Zener diode of the invention may be employed to regulate voltage supplied to the collector of one or more transistors. Transistors are easily damaged if the collector voltage becomes too high. The three-terminal diode of the invention effectively prevents this in the manner described above.

A way to construct the illustrated diode embodiment will be described with reference to FIGS. 2 and 3. Various parts and sub-assemblies are provided, and these are put together by hand and by machines to fabricate the complete unit. The base 11 is stamped out from copper sheet material, and has a diamond shape as indicated in FIG. 3. The ends of the diamond are provided with openings 51 and 52 to receive screws or the like which may be used to fasten the base to a chassis, such as the panel 26 illustrated in FIG. 1, or to a heat sink member provided with cooling fins for purposes of maximum heat dissipation. The base 11 has a circular groove 53 formed therein to receive the edge of the cap 12. The integral pedestal 21 which provides one electrode for the semiconductor unit is swaged on the base by the stamping. The holes through which the pins 16 and 17 extend are drilled through the base. The entire base member 11 is gold plated, and the base is placed upon a moving belt which passes through an assembly furnace. The atmosphere within the assembly furnace is hydrogen or some other suitable non-oxidizing gas. The belt carries the base to several assembly stations at which the other parts and sub-assemblies are put into place on the base.

Solder ring preforms are placed concentrically around the two holes that receive the terminal pins. A "feed-through" which consists of a brass pin with a glass insulating ring as 23 secured to the pin, and a metal sleeve as 25 secured to the outside of the glass ring, is dropped through each of the solder rings mentioned above and into the holes in the base 11.

Next, a lead-tin solder disc 56 is placed upon the top of the pedestal 21. Then a diffused silicon die 19 in the form of a disc and having its opposite faces gold plated is placed on the solder disc 56. Another solder disc 57 is put on top of the silicon die 19, and the clip 14 is then mounted on small beads 58 provided on top of the pins 16 and 17. The upper ends of the pins fit through openings 59 provided in clip 14. Two small solder rings 61 are placed over the upper ends of the pins 16 and 17 resting on the raised portions of the clip encircling the openings 59. The tongue portion 18 of the clip contacts the solder disc 57 on the semiconductor element 19.

The belt carries this assembly through a furnace, and the heat of this furnace solders the various parts together. The "feed-throughs" are soldered to the base 11, the clip 14 is soldered to the two pins 16 and 17, and the silicon die 19 is soldered to the pedestal 21 and to the tongue 18 of the clip 14.

The unit is tested for electrical performance, and if found to be satisfactory the cap 12 is welded to the base 11 as indicated in FIG. 1. If the unit is not electrically satisfactory after the first test, it is etched in a mixture of hydrofluoric acid and nitric acid, washed, dried and re-tested for electrical performance. Satisfactory units are capped, and unsatisfactory units may be re-etched and then capped if found to be acceptable.

After capping the units, the enclosure 13 is evacuated through a small eyelet 65 provided in the base 11. After evacuation and back-fill the eyelet is pinched off and the unit is then hermetically sealed.

Figure 2:
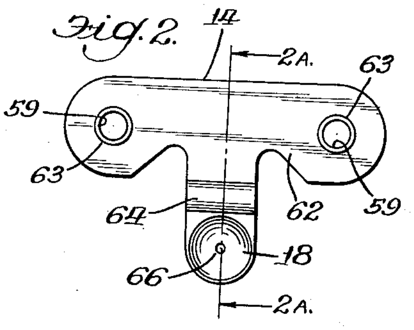
Figure 2A:
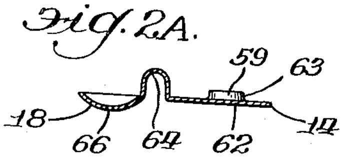
Figure 3:
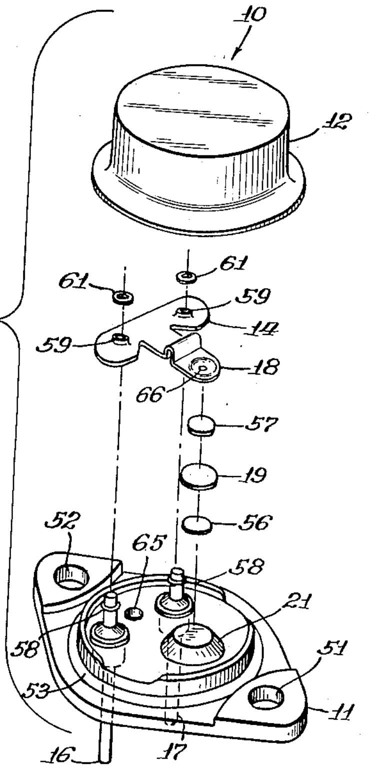
FIG. 3 is a partially exploded view of the diode of FIG. 1 showing certain ones of the elements that are assembled to provide the complete structure.

The shape of the jumper clip 14 is illustrated in FIGS. 2 and 2a. The clip is stamped from copper sheet approximately .01 inch thick to have the general T-shape illustrated in FIG. 2. The bridging portion 62 is generally flat, and the pin openings 59 encircled by the raised portions 63 are formed near the ends of the bridging portion 62. The tongue portion 18 includes a flexible point 64 in the form of a hump which allows for expansion and contraction of the diode parts due to the heat generated during operation of the unit. The end of the tongue portion 18 is dish-shaped, and a small opening 66 is pierced in the center of this dish-shaped area to facilitate soldering. The openings 59 fit snugly on the pins 16 and 17, and this causes the tongue 18 to flex slightly when the clip is assembled in place with the dish-shaped portion contacting the solder disc 57 on the silicon die 19. Thus, the tongue 18 is biased against the semiconductor unit to ensure good electrical contact.

Figure 7:
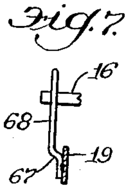
FIG. 7 is a side view which serves somewhat schematically to show how both of the modified connecting means are formed at their ends soldered to the semiconductor element.

The modification of the connecting means illustrated in FIG. 5 comprises a wire 66 of metal formed into a one-piece V-shaped and assembled by simple jigging so that it may be conveniently soldered to the terminal pins 16 and 17 and to the semiconductor element 19. The forward portion 67 is shaped as shown in FIG. 7 to facilitate soldering and provides for a "cleaner" connection to the die.

FIG. 6 illustrates a similar embodiment wherein the wire connecting means comprises two pieces which by means of simple jigging are each secured between a terminal pin and the semiconductor element.

The complete unit is very rugged mechanically, and since it is formed almost entirely from simple stamped or formed parts, it is economical. The base member 11 is quite thick and has a large surface area in contact with the semiconductor die 19 and an even larger area in contact with the chassis 26. This provides a very effective heat transfer path such that the temperature rise between the diffused junction of the die unit 19 and the base 11 is approximately one degree centigrade per watt of power dissipated.

The unit may be conveniently mounted and plugged into sockets as described above, and the three terminal construction in combination with the connecting means provides effective load protection when the unit is unplugged as described above. While the particular embodiment of the invention described and illustrated is a Zener diode suitable for voltage regulation applications, the three-terminal diode construction with an internal connecting means is not limited to diodes of the Zener type. The construction is, however, very advantageous for Zener diodes in particular.

I claim:

1. A semiconductor diode device including in combination, enclosure means having a portion forming a terminal for the device, a junction semiconductor diode unit positioned in said enclosure means and having a pair of opposed faces with one face electrically connected to said enclosure means portion, a pair of lead wires extending through said enclosure means, conductor means positioned within said enclosure means and electrically connecting said lead wires together for providing a first current path in one of said lead wires through said conductor means and out the other of said lead wires, said conductor means having a portion connected to the other face of said semiconductor diode unit providing a second current path through said portion of said enclosure means forming said terminal, through said semiconductor diode unit, and through one of said lead wires.

2. A semiconductor diode device including in combination, a metal mounting base, a junction semiconductor diode unit having electrical characteristics adapted to provide power regulation, said semiconductor diode unit being positioned on one side of said mounting base and having first and second opposed faces, with said first face electrically connected to said mounting base whereby said mounting base constitutes a first terminal, second and third terminal members supported by said mounting base and adjacent to but spaced from said semiconductor diode unit, said terminal members being insulated from said mounting base and each having portions available on the side of said mounting base opposite said one side for making external electrical connections for the device, and a metal bridge on said one side of said base electrically connecting said second and third terminal members together providing a series circuit path in said second terminal through sad metal bridge and out said third treminal, said bridge having a portion connected to said second face of said semiconductor diode unit providing a circuit path through said first and second terminals and said semiconductor diode unit in series, such that said semiconductor device is adapted to serve a power regulating function in an electrical circuit and to protect a load portion of such circuit from unregulated voltage upon removal of said device from such circuit.

3. A semiconductor diode device in accordance with claim 2 wherein said semiconductor diode unit has a conduction characteristic of the Zener type.

4. A Zener diode device adapted for use with a socket, including in combination, a metal mounting base, a cover secured to said mounting base forming an enclosure, a junction semiconductor diode unit of the Zener type positioned in said enclosure and having a pair of opposed faces, said mounting base having a mounting portion connected in electrical and heat conducting relation to one of said opposed faces of said semiconductor unit, a pair of terminal wires extending through said mounting base into said enclosure, a T-shaped jumper clip having a bridge portion extending between and supported by said terminal wires within said enclosure and providing a first current path through said terminal wires and said clip, said jumper clip having a tongue portion extending transversely from said bridge portion to a position over said semiconductor diode unit, said tongue portion being connected in electrical conducting relation to the other face of said semiconductor diode unit to provide a second current path through one of said terminal wires, through said semiconductor diode unit, and through said base, and said tongue portion having a hump therein to allow for expansion and contraction of the associated parts caused by heat generated within said enclosure, whereby said device is adapted to serve a power regulating function in an electrical circuit and to protect a load portion of such circuit from unregulated voltage upon removal of said device from such circuit.

5. A diode device including in combination, a metal mounting base, a junction semiconductor diode unit positioned on one side of said mounting base and having a pair of opposed faces, means connecting said mounting base to one of said faces of said semi-conductor diode unit in electrical and heat conducting relation, a pair of terminal wires extending through said mounting base having portions positioned adjacent said semiconductor diode unit and having portions on the side of said mounting base opposite the side of which said semiconductor unit is positioned for making external electrical connections, means insulating said terminal wires from said mounting base, conductor means positioned on said one side of said mounting base, said conductor means having resilient arms extending angularly with respect to each other forming a V-shape, with the ends of said arms at the opening of said V-shape being connected respectively to said terminal wires and the ends of said arms at the point of said V-shape being connected to the other face of said diode unit.

6. In a semiconductor device which has a mounting base with a semiconductor mounting portion thereon, and a pair of terminal wires supported by said mounting base with portions of the terminal wires adjacent to but spaced from said mounting portion and with other portions of said terminal wires extending through the mounting base and available for making external electrical connections, the combination including a semiconductor diode unit having electrical characteristics adapted for power regulation functions and having opposed faces with one face electrically connected to said mounting portion of said mounting base, a one-piece metal clip having a bridging portion extending between and supported by said terminal wires adjacent to and spaced from said semiconductor diode unit and providing a first circuit path through said terminal wires and through said clip, said clip having a resilient portion extending transversely from said bridging portion to a position over said semiconductor diode unit, said resilient portion being connected in electrically conducting relation to the other face of said semiconductor diode unit to provide a second circuit path through said terminal wires, through said semiconductor diode unit, and through said mounting base.

7. A semiconductor device adapted to be connected into an electrical circuit including an electrical power supply, an electrical load and a point of reference potential for regulating power supplied to the load from the power supply and for providing an open circuit between the power supply and the load when the semiconductor device is physically disconnected from the electrical circuit which open circuit is effective to protect the load from unregulated voltage, said semiconductor device including in combination a semiconductor unit having electrical characteristics adapted to provide power regulation and having first and second connection portions constituting the only electrical connections to said semiconductor unit, first and second electrical terminal units each having a portion adapted for connection to said first connection portion of said semiconductor unit and a portion available for making electrical connections externally of the device, said first terminal unit being adapted to be connected externally of the device to the power supply and said second terminal unit being adapted to be connected externally of the device to the electrical load, conductor means connecting said first and second terminal units and said first connection portion of said semiconductor unit in electrically common relation with each other, and mounting means supporting said semiconductor unit and said terminal units, said mounting means having conductive structure forming a third electrical terminal electrically insulated from said first and second terminal units and electrically common with said second connection portion of said semiconductor unit, with said conductive structure of said mounting means being available externally of the device for connection to the point of reference potential, whereby upon connection of said semiconductor device into said electrical circuit and subsequent removal of said device from said circuit, all of said terminals are thereby disconnected from said circuit and the load portion of said circuit is protected from unregulated voltage.

References Cited in the file of this patent

UNITED STATES PATENTS 2,914,716 Larrison ---------------- Nov. 24, 1959